US012615720B2

(12) United States Patent
Jiang et al.

(10) Patent No.: US 12,615,720 B2
(45) Date of Patent: Apr. 28, 2026

(54) ASSEMBLING METHOD OF ELECTRONIC MODULE

(71) Applicant: Delta Electronics, Inc., Taoyuan City (TW)

(72) Inventors: Kun Jiang, Shanghai (CN); Xi Liu, Shanghai (CN); Xiaodong Chen, Shanghai (CN)

(73) Assignee: Delta Electronics, Inc., Taoyuan City (TW)

( * ) Notice: Subject to any disclaimer, the term of this patent is extended or adjusted under 35 U.S.C. 154(b) by 75 days.

(21) Appl. No.: 18/198,693

(22) Filed: May 17, 2023

(65) Prior Publication Data

US 2023/0413450 A1 Dec. 21, 2023

(30) Foreign Application Priority Data

May 23, 2022 (CN) ........................ 202210563823.X

(51) Int. Cl.
| | |
|---|---|
| *H05K 3/36* | (2006.01) |
| *B23K 1/00* | (2006.01) |
| *H05K 1/14* | (2006.01) |
| *H05K 3/341* | (2026.01) |
| *H05K 3/3494* | (2026.01) |
| *B23K 101/42* | (2006.01) |

(52) U.S. Cl.
CPC ........... *H05K 3/368* (2013.01); *B23K 1/0016* (2013.01); *H05K 1/144* (2013.01); *H05K 3/341* (2013.01); *H05K 3/3494* (2013.01); *B23K 2101/42* (2018.08); *H05K 2201/042* (2013.01); *H05K 2201/10734* (2013.01); *H05K 2201/10984* (2013.01); *H05K 2203/043* (2013.01)

(58) Field of Classification Search
None
See application file for complete search history.

(56) References Cited

U.S. PATENT DOCUMENTS

| | | | | |
|---|---|---|---|---|
| 4,807,021 A | * | 2/1989 | Okumura | ................ H01L 24/11 |
| | | | | 257/E23.021 |
| 5,155,904 A | * | 10/1992 | Majd | .................... H05K 3/3415 |
| | | | | 228/180.1 |
| 5,167,361 A | * | 12/1992 | Liebman | .............. H05K 3/3415 |
| | | | | 228/173.3 |
| 6,657,124 B2 | * | 12/2003 | Ho | .......................... H01L 24/81 |
| | | | | 257/E21.511 |

(Continued)

FOREIGN PATENT DOCUMENTS

| | | |
|---|---|---|
| CN | 1187030 A | 7/1998 |
| CN | 114009156 A | 2/2022 |

(Continued)

*Primary Examiner* — Devang R Patel
(74) *Attorney, Agent, or Firm* — KIRTON McCONKIE; Evan R. Witt

(57) ABSTRACT

An assembling method of an electronic module is disclosed and includes steps of: (a) providing a first circuit board including a first side and a second side; (b) providing a second circuit board including a third side and a fourth side, and a connection component connected to the third side; (c) providing a solder ball, and stacking the first circuit board, the second circuit board and the solder ball; and (d) performing a reflow soldering process to a stacked structure of the first circuit board, the second circuit board and the solder ball.

19 Claims, 11 Drawing Sheets

(56)  References Cited

U.S. PATENT DOCUMENTS

| | | | | |
|---|---|---|---|---|
| 6,854,636 B2* | 2/2005 | Farooq | ............... | H01L 21/6835 |
| | | | | 257/E23.021 |
| 7,042,088 B2* | 5/2006 | Ho | .......................... | H01L 24/81 |
| | | | | 257/E23.021 |
| 7,626,126 B2* | 12/2009 | Shibata | ................. | H01L 25/105 |
| | | | | 174/260 |
| 9,893,043 B2* | 2/2018 | Chen | ................... | H01L 25/0657 |
| 2002/0079577 A1* | 6/2002 | Ho | ....................... | H05K 3/3436 |
| | | | | 257/E21.511 |
| 2021/0315107 A1* | 10/2021 | Vasudevan | ........... | H05K 3/3489 |

FOREIGN PATENT DOCUMENTS

| | | | | | |
|---|---|---|---|---|---|
| JP | H0982756 A | | 3/1997 | | |
| JP | 2006313799 A | * | 11/2006 | | |
| JP | 2015142024 A | | 8/2015 | | |
| WO | WO-2020214148 A1 | * | 10/2020 | ............. | H05K 1/141 |

* cited by examiner

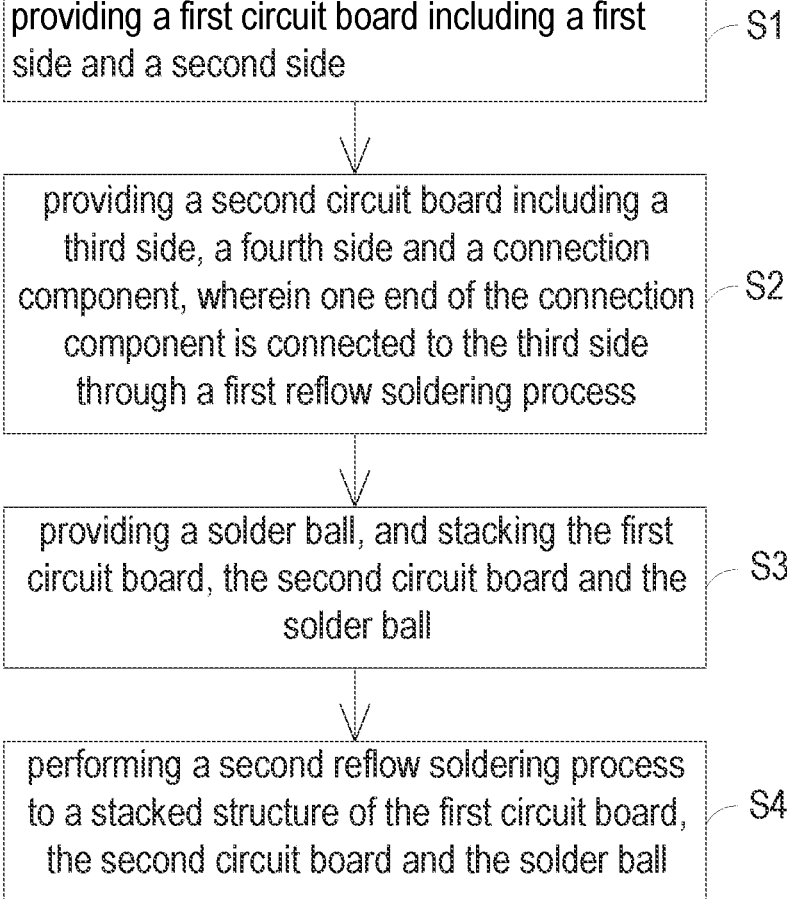

providing a first circuit board including a first side and a second side — S1 providing a second circuit board including a third side, a fourth side and a connection component, wherein one end of the connection component is connected to the third side through a first reflow soldering process — S2 providing a solder ball, and stacking the first circuit board, the second circuit board and the solder ball — S3 performing a second reflow soldering process to a stacked structure of the first circuit board, the second circuit board and the solder ball — S4

FIG. 4

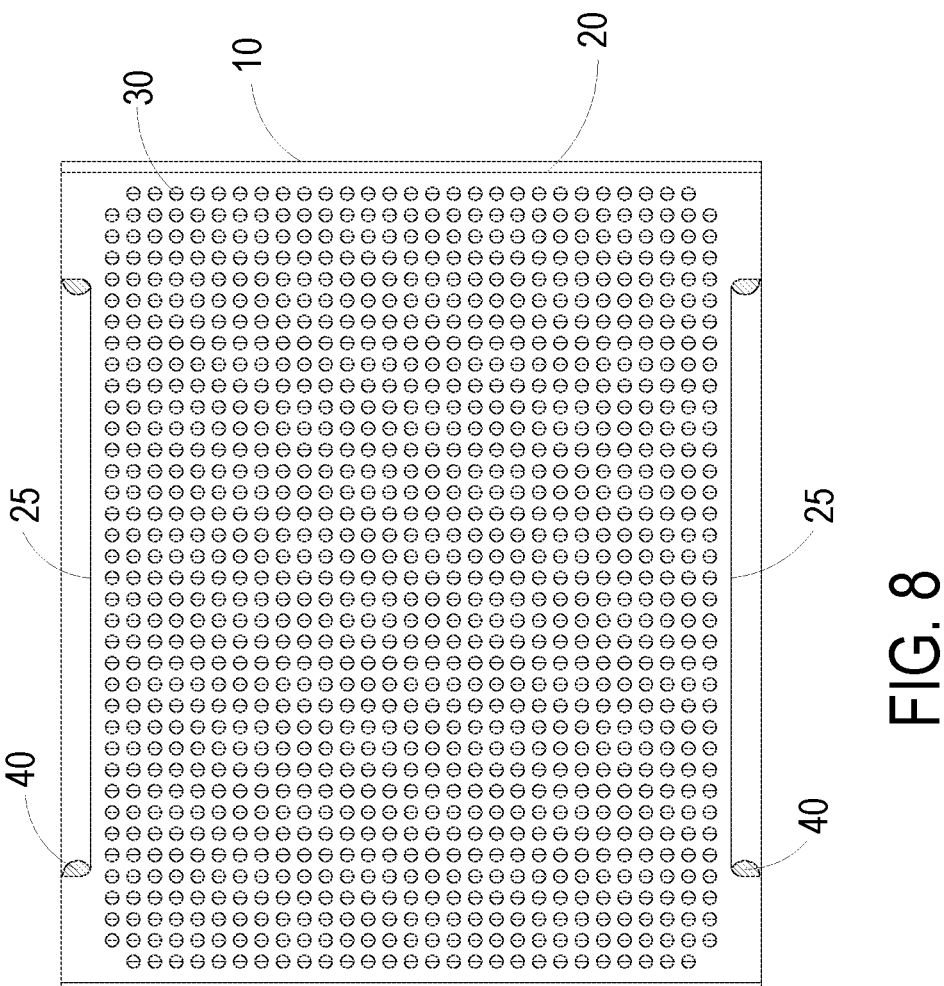
1a
30
10
20
25
25
40
40
FIG. 8
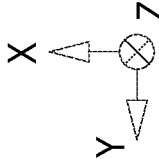

ASSEMBLING METHOD OF ELECTRONIC MODULE

CROSS-REFERENCE TO RELATED APPLICATION

This application claims priority to China Patent Application No. 202210563823. X, filed on May 23, 2022. The entire contents of the above-mentioned patent application are incorporated herein by reference for all purposes.

FIELD OF THE INVENTION

The present disclosure relates to an assembling method of an electronic module.

BACKGROUND OF THE INVENTION

In recent years, with the miniaturization of electronic products, it is necessary to improve the efficiency of the electronic module and further increase the power density by reducing the volume. In order to significantly reduce the volume and weight of the power module and increase the power density of the electronic module, the conventional electronic module on the market having two circuit boards stacked has become a normal design. In case of that the two stacked circuit boards have to be assembled through the soldering assembly technology, each circuit board includes two opposite soldering sides for disposing the electronic components thereon through a reflow soldering process, or for fixing the electronic module to the system board in an electrical connection. Furthermore, the connection between the two circuit boards needs to be implemented through a bidirectional-conductive connection component, and another reflow soldering process is performed to assemble the electronic module.

On the other hand, when the electronic module is connected to the system board through the solder ball, the solder ball needs to be pre-disposed on the electronic module. Since the disposition of the solder ball is the same as that of the electronic components, both of them need to be implemented through the reflow soldering process, and the solder ball must be disposed on an outer soldering side of the electronic module, so as to spatially correspond to the system board. In the electronic module with two circuit boards stacked, one circuit board spatially corresponds to the system board. On the circuit board spatially corresponding to the system board, the solder ball needs to be arranged on the outer soldering side through a reflow soldering process (i.e., a first reflow soldering process), the electronic component and the bidirectional-conductive connection component need to be arranged on an opposite soldering sides through another reflow soldering process (i.e., a second reflow soldering process). Thereafter, another reflow soldering process (i.e., a third reflow soldering process) is preformed to achieve the connection of the two circuit boards through the bidirectional conductive connection component. In that, one of two opposite soldering sides of the circuit board adjacent to the system board has to undergo at least three reflow soldering processes to complete the assembly structure of the electronic module. In other words, when the electronic module is produced by the conventional assembling method, the solder ball used to connect the system board or the bidirectional-conductive connection component used to connect two stacked circuit boards need to undergo more than three reflow soldering processes to complete the entire assembly. The manufacturing time is long and the cost is high. Furthermore, the risk of damaging the solder ball, the bidirectional-conductive connection component or other electronic components during the high-temperature reflow soldering process is increased, and the reliability of soldering joints between the electronic module and the system board is reduced.

Therefore, there is a need of providing an assembling method of an electronic module capable of obviating the drawbacks encountered by the prior arts.

SUMMARY OF THE INVENTION

In accordance with an aspect of the present disclosure, an assembling method of an electronic module is provided and includes steps of: (a) providing a first circuit board including a first side and a second side; (b) providing a second circuit board including a third side, a fourth side and a connection component, wherein one end of the connection component is connected to the third side through a first reflow soldering process; (c) providing a solder ball, and stacking the first circuit board, the second circuit board and the solder ball; and (d) performing a second reflow soldering process to a stacked structure of the first circuit board, the second circuit board and the solder ball.

In accordance with another aspect of the present disclosure, an assembling method of an electronic module is provided and includes steps of: (a) providing a first circuit board including a first side and a second side; (b) providing a second circuit board including a third side, a fourth side and a connection component, wherein one end of the connection component is connected to the third side; (c) providing a solder ball, and stacking the first circuit board, the second circuit board and the solder ball; and (d) performing a reflow soldering process to a stacked structure of the first circuit board, the second circuit board and the solder ball.

BRIEF DESCRIPTION OF THE DRAWINGS

The above contents of the present disclosure will become more readily apparent to those ordinarily skilled in the art after reviewing the following detailed description and accompanying drawings, in which:

FIG. 4 is a flow chart illustrating an assembling method of the electronic module according to the first embodiment of the present disclosure;

FIG. 8 is a top view illustrating the electronic module according to the second embodiment of the present disclosure.

DETAILED DESCRIPTION OF THE PREFERRED EMBODIMENT

Figure 1:
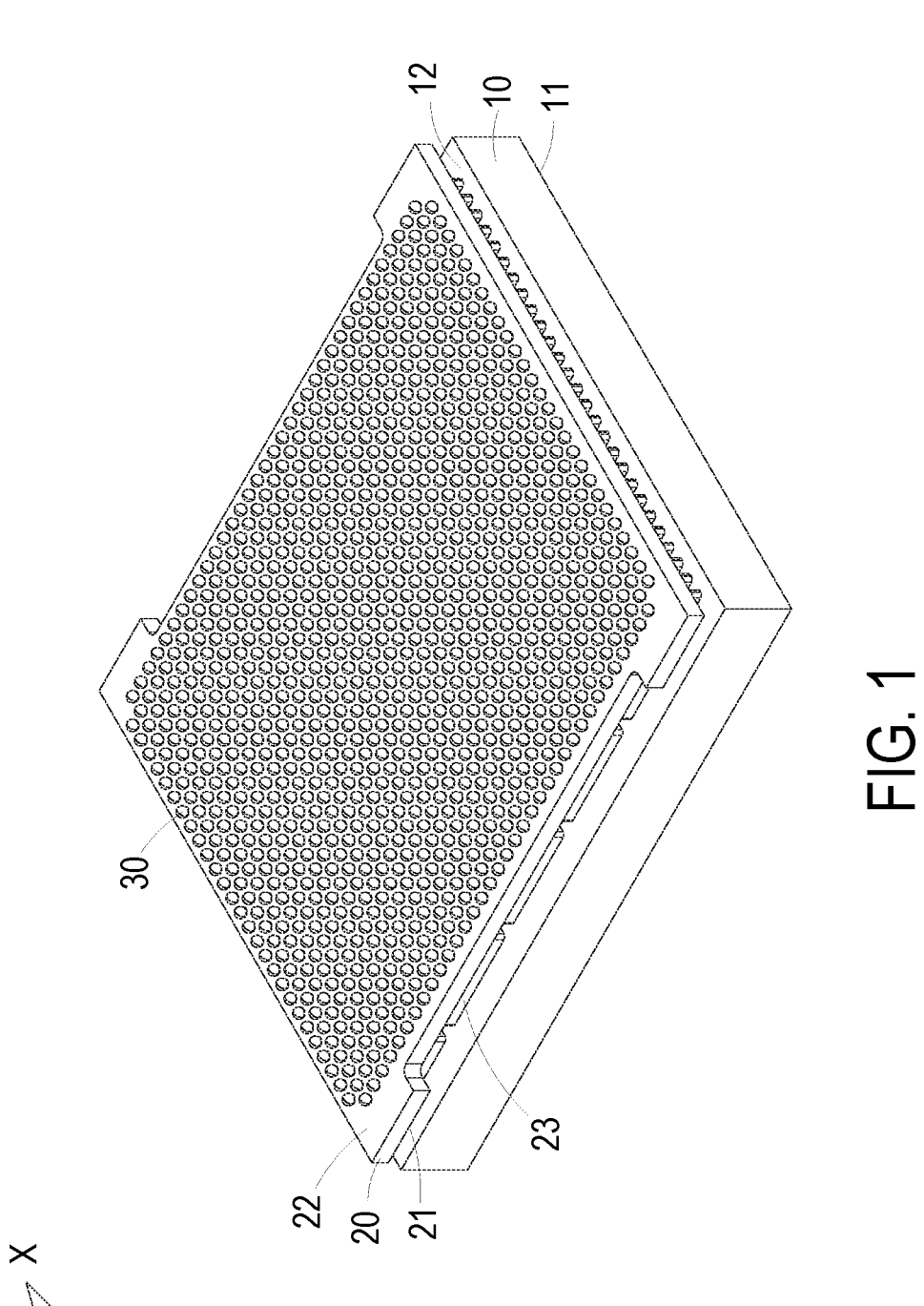
FIG. 1 is a schematic structural view illustrating an electronic module according to a first embodiment of the present disclosure.

The present disclosure will now be described more specifically with reference to the following embodiments. It is to be noted that the following descriptions of embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "below," "under," "lower," "over," "upper" and the like, may be used herein for ease of describing one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements described in the respective embodiments may be expressed by the different reference numerals. These terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items.

Figure 2A:
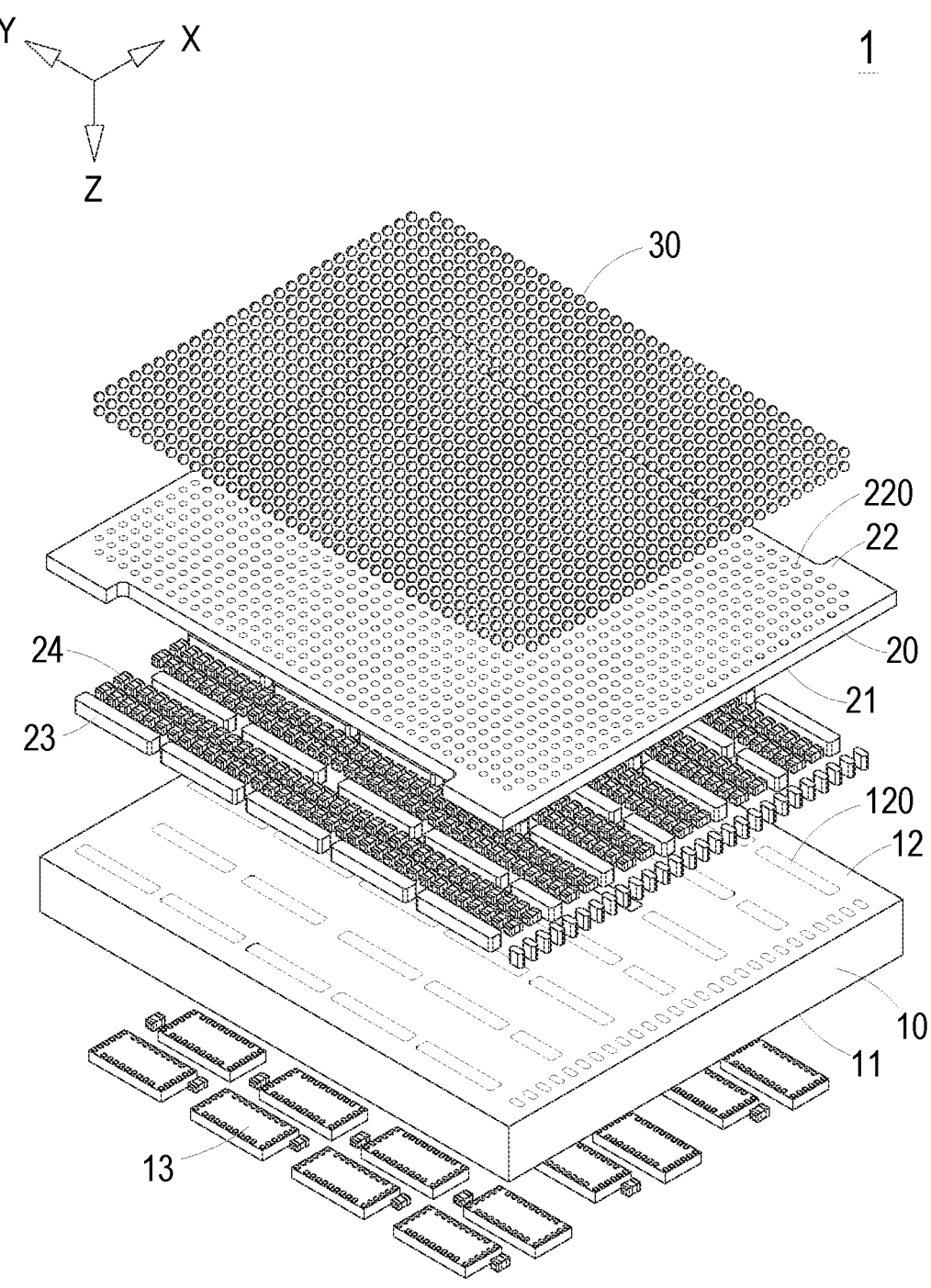
FIG. 2A is an exploded view illustrating the electronic module according to the first embodiment of the present disclosure.
Figure 2B:
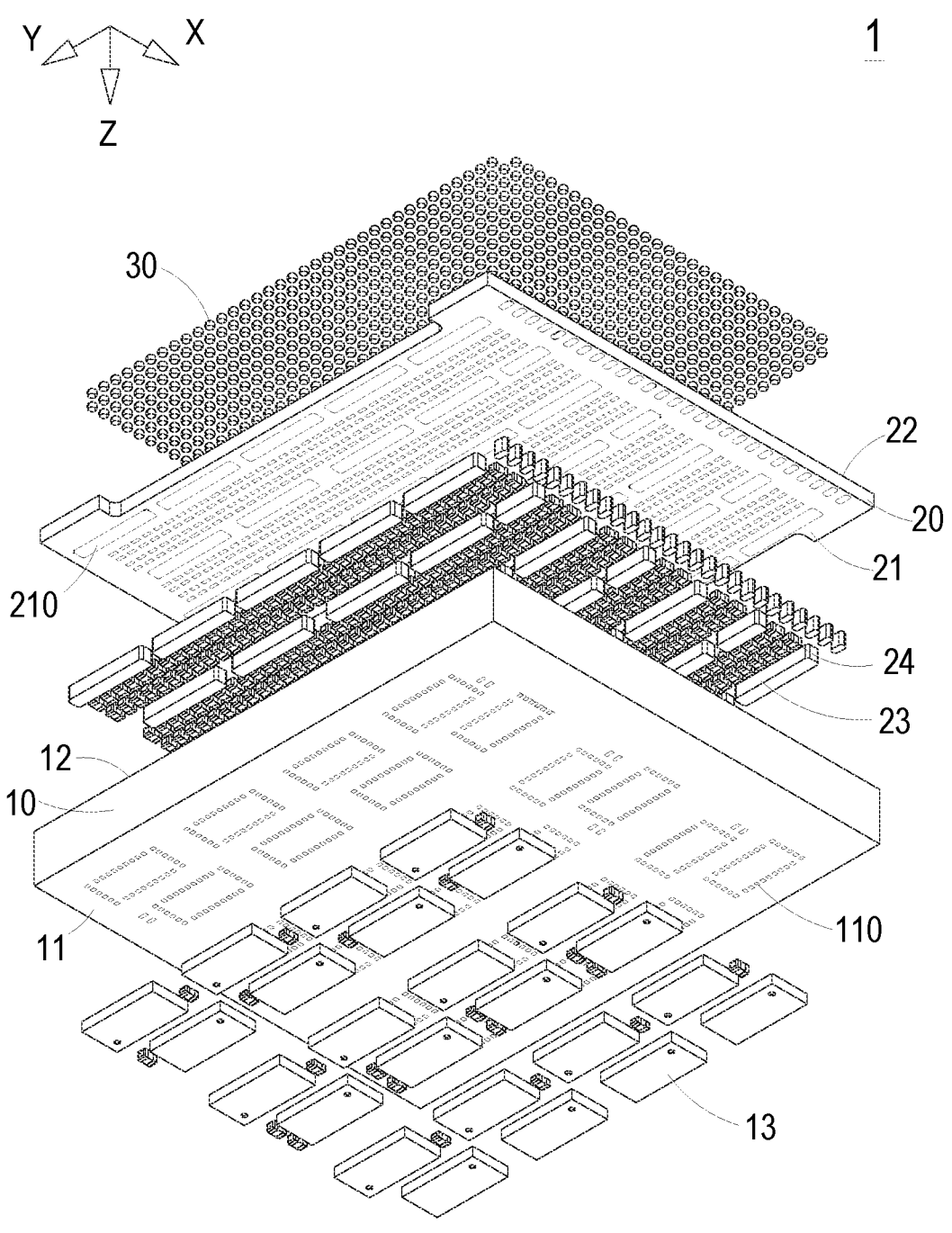
FIG. 2B is an exploded view illustrating the electronic module according to the first embodiment of the present disclosure and taken from another perspective.
Figure 3:
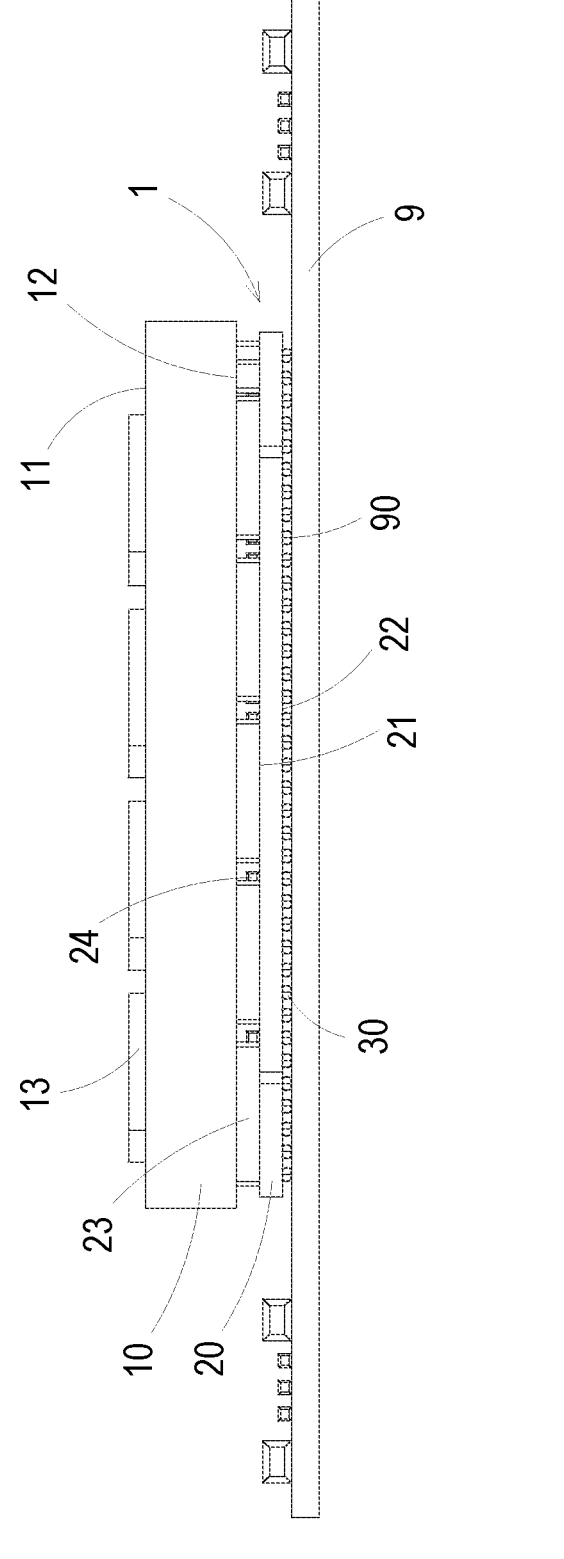
FIG. 3 is a lateral view illustrating the electronic module connected to a system board according to the first embodiment of the present disclosure.

FIG. 1 is a schematic structural view illustrating an electronic module according to a first embodiment of the present disclosure. FIGS. 2A and 2B are an exploded view illustrating the electronic module according to the first embodiment of the present disclosure. FIG. 3 is a lateral view illustrating the electronic module connected to a system board according to the first embodiment of the present disclosure. In the embodiment, the electronic module 1 includes a first circuit board 10, a second circuit board 20 and a solder ball 30 stacked in sequence, so that a stacked structure of the first circuit board 10, the second circuit board 20 and the solder ball 30 is formed. The first circuit board 10 includes a first side 11 and a second side opposite to each other. In the embodiment, the first circuit board 10 further includes a first electronic component 13. Preferably but not exclusively, the first electronic component 13 is pre-disposed on a soldering pad 110 of the first side 11 through a reflow soldering process. In other embodiments, the first electronic component 13 is pre-disposed on the first side 11 and/or the second side 12 through a welding process or other methods, and the present disclosure is not limited thereto. In the embodiment, the second circuit board 20 includes a third side 21 and a fourth side 22 opposite to each other. In addition, the third side 21 of the second circuit board 20 is spatially corresponding to the second side 12 of the first circuit board 10, and the third side 21 of the second circuit board 20 is arranged adjacent to the second side 12 of the first circuit board 10. In the embodiment, the second circuit board 20 includes a connection component 23 and a second electronic component 24. Preferably but not exclusively, the connection component 23 and the second electronic component 24 are pre-disposed on the soldering pads 210 of the third side 21 through a reflow soldering process (i.e., a first reflow soldering process). Preferably but not exclusively, the connection component 23 is one selected from the group consisting of a copper pillar, a copper blocks, a pin header and a copper foil. Moreover, the connection component 23 is electrically connected between the first circuit board 10 and the second circuit board 20. In other embodiments, the arrangements of the connection component 23 and the second electronic component 24 are adjustable according to the practical requirements, and the present disclosure is not limited thereto. In the embodiment, the solder ball 30 is spatially corresponding to the fourth side 22 of the second circuit board 20, and arranged on the fourth side 22 of the second circuit board 20 to form a ball grid array (BGA) of the electronic module 1, which is used to package by a surface-mount technology. The assembled electronic module 1 can be surface-mounted and soldered to a system board 9. For example, after the electronic module 1 is flipped at 180 degrees, the fourth side 22 faces the soldering surface 90 of the system board 9, and the solder ball 30 of the electronic module 1 contacts the soldering surface 90 of the system board 9. Thereafter, the electronic module 1 can be installed on the system board 9 through a reflow soldering process.

Notably, in the embodiment, the first circuit board 10, the second circuit board 20 and the solder ball 30 are stacked by for example but not limited to the surface-mount technology, and then a reflow soldering process is performed to the stacked structure of the first circuit board 10, the second circuit board 20 and the solder ball 30 to obtain the electronic module 1. Since one reflow soldering process is performed on the solder ball 30 and the two stacked circuit boards simultaneously, when the electronic module 1 is further matched and connected with the system board 9, the solder ball 30 undergoes no more than two reflow soldering processes. It helps to eliminate the risk of damaging the solder ball 30 during the high-temperature reflow soldering process, so that the soldering reliability of the electronic module 1 and the system board 9 is improved. The assembling method of the electronic module 1 is further described in detail as follows.

FIG. 4 is a flow chart illustrating an assembling method of the electronic module according to the first embodiment of the present disclosure. Please refer to FIGS. 1 to 4. In order to assemble the electronic module 1, as shown in the step S1, a first circuit board 10 is provided. The first circuit board 10 includes a first side 11 and a second side 12 opposite to each other. Preferably but not exclusively, the first circuit board 10 includes a first electronic component 13 disposed on the first side 11 or/and the second side 12 according to the practical requirements. In the embodiment, the first electronic component 13 is disposed on the first side 11, and the second side 12 of the first circuit board 10 is configured for subsequent structural stacking. In addition, as shown in the step S2, a second circuit board 20 is provided. The second circuit board 20 includes a third side 21 and a fourth side 22 opposite to each other. In the embodiment, the second circuit board 20 further includes a connection component 23 and a second electronic component 24 disposed on the third side 21. Preferably but not exclusively, the second electronic component 24 and the connecting component 23 are misaligned with each other, and a height of the connection component 23 is greater than or equal to a height of the second electronic component 24. Preferably but not exclusively, in the embodiment, the dispositions of the connection component 23 and the second electronic component 24 are implemented through a reflow soldering process (i.e., a first reflow soldering process). One end of the connection component 23 is connected to the soldering pad 210 of the third side 21. In other embodiments, the connection component 23 is pre-disposed on the third side 21 of the second circuit board 20 through the other bonding methods. The present disclosure is not limited thereto and not redundantly described herein. Thereafter, as shown in the step S3, the first circuit board 10, the second circuit board 20 and the solder ball 30 are stacked to form a stacked structure. In the embodiment, since the second electronic component 24 and the connection component 23 are misaligned with each other, and the height of the connection component 23 is greater than or equal to the height of the second electronic component 24, when the third side 21 of the second circuit board 20 is stacked towards the second side 12 of the first circuit board 10, another end of the connection component 23 is placed on the second side 12 of the first circuit board 10, and abutted against the soldering pad 120. In addition, the solder ball 30 is placed on the fourth side 22 of the second circuit board 20 through the surface-mount technology. Finally, as shown in the step S4, another reflow soldering process (i.e., a second reflow soldering process) is performed to the stacked structure of the first circuit board 10, the second circuit 30 and the solder ball 30. The end of the connection component 23 is fixedly connected to the second side 12 of the first circuit board 10, and the connection component 23 is fixedly connected between the second side 12 of the first circuit board 10 and the third side 21 of the second circuit board 20. Furthermore, the solder ball 30 is fixedly connected to the fourth side 22 of the second circuit board 20 to complete the assembling process of the electronic module 1. Notably, the number of the reflow soldering processes that the solder ball 30 undergoes during the assembling process is one time. When the electronic module 1 is further matched and connected with the system board 9, the solder ball 30 undergoes two reflow soldering processes in total. The risk of damaging the solder ball 30 during the high-temperature reflow soldering process is reduced sufficiently, and the reliability of soldering joints between the electronic module 1 and the system board 9 is improved at the same time.

Preferably but not exclusively, in the embodiment, the first electronic component 13 is pre-disposed on the first side 11 and/or the second side 12 of the first circuit board 10 through one reflow soldering process (i.e., the first reflow soldering process). Moreover, another reflow soldering process (i.e., the second reflow soldering process) is performed to the stacked structure of the first circuit board 10, the second circuit board 20 and the solder ball 30, so that the first electronic component 13 undergoes the high-temperature reflow soldering process, again. Therefore, the number of the reflow soldering processes that the first electronic component 13 undergoes during the assembling process is two times. When the electronic module 1 is further matched and connected with the system board 9, the number of the reflow soldering processes that the first electronic component 13 undergoes is no more than three times. It facilitates to reduce the risks of detachment or displacement of the first electronic component 13 during the high-temperature reflow soldering process, and improve the production reliability of the electronic module 1.

Preferably but not exclusively, in the embodiment, the connection component 23 and the second electronic component 24 are pre-disposed on the third side 21 of the second circuit board 20 through one reflow soldering process (i.e., the first reflow soldering process). Moreover, another reflow soldering process (i.e., the second reflow soldering process) is performed to the stacked structure of the first circuit board 10, the second circuit board 20 and the solder ball 30, so that the connection component 23 and the second electronic component 24 undergoes the high-temperature reflow soldering process, again. Therefore, the number of the reflow soldering processes that the connection component 23 and the second electronic component 24 undergo during the production process is two times. When the electronic module 1 is further matched and connected with the system board 9, the number of the reflow soldering processes that the connection component 23 and the second electronic component 24 undergo is no more than three times. It facilitates to reduce the risks of detachment or displacement of the connection component 23 and the second electronic component 24 during the high-temperature reflow soldering process, and improve the production reliability of the electronic module 1.

As can be seen from the above, the numbers of the reflow soldering processes that the first electronic component 13, the connection component 23 and the second electronic component 24 undergo are reduced by improving the assembling process of the first circuit board 10, the second circuit board 20 and the solder ball 30 in the present disclosure. Thus, the production process of the electronic module 1 is simplified, the investment in production equipment is saved, and the space for equipment placement in the production workshop is saved. Furthermore, it helps to improve the production efficiency of the electronic modules and the reliability of soldering joints in the electronic module 1.

Figure 5A:
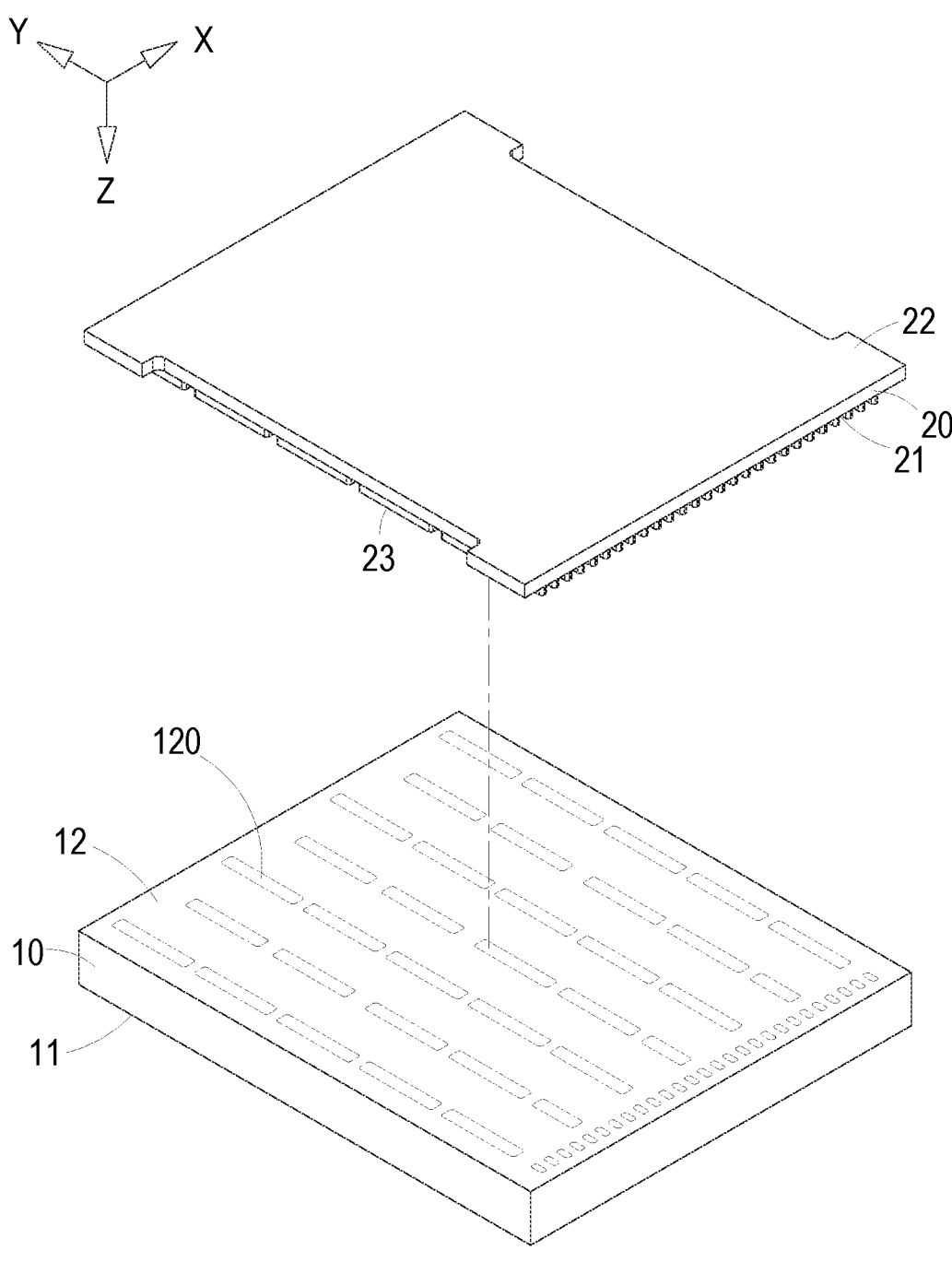
FIGS. 5A and 5B show a first example of stacking the first circuit board, the second circuit board and the solder ball according to the assembling method of the present disclosure.
Figure 5B:
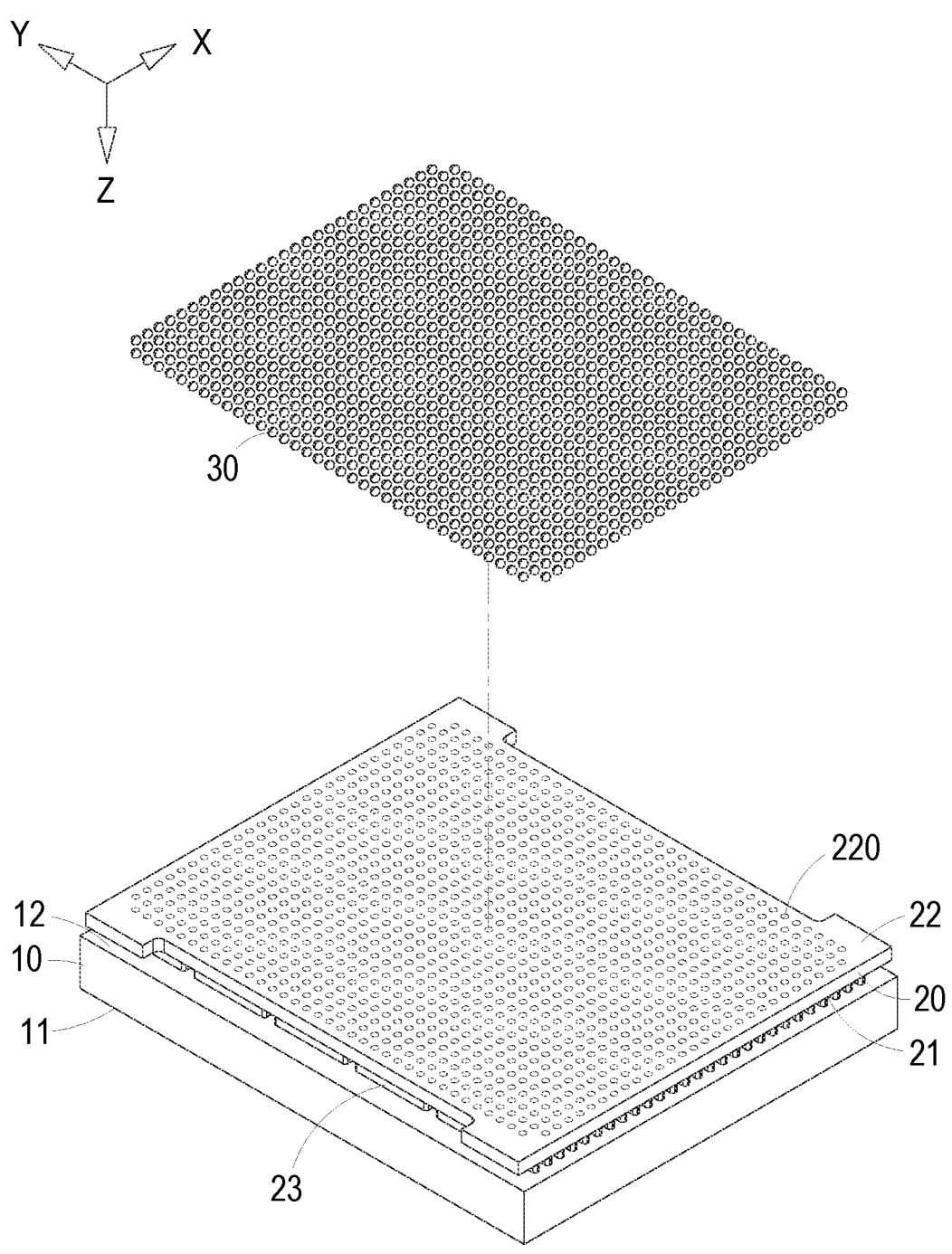

Notably, in the embodiment, the stacking process of the first circuit board 10, the second circuit board 20 and the solder ball 30 before the reflow soldering process (i.e., the second reflow soldering process) is adjustable according to the practical requirements. FIGS. 5A and 5B show a first example of stacking the first circuit board, the second circuit board and the solder ball according to the assembling method of the present disclosure. In the embodiment, solder paste is pre-painted on the soldering pad 120 on the second side 12 of the first circuit board 10. In addition, as shown in FIG. 5A, with the third side 21 of the second circuit board 20 facing the second side 12 of the first circuit board 10, the second circuit board 20 is placed on the second side 12 of the first circuit board 10 by for example but not limited to the surface-mount technology, so that the lower end of the connection component 23 is abutted against the soldering pad 120 on the second side 12. Next, as shown in FIG. 5B, solder paste is pre-painted on the soldering pad 220 on the fourth side 22 of the second circuit board 20, and the solder ball 30 is placed on the fourth side 22 of the second circuit board 20 by for example but not limited to the surface-mount technology. At this time, the first circuit board 10, the second circuit board 20 and the solder ball 30 are stacked as the structure described above. The soldering between the connection component 23 and the soldering pad 120 with the pre-painted solder paste on the second side 12 has not been completed, and the soldering between the solder ball 30 and the soldering pad 220 with the pre-painted solder paste on the fourth side 22 has not been completed. After performing one reflow soldering process (i.e., the second reflow soldering process), the connection component 23 is fixedly connected between the second side 12 of the first circuit board 10 and the third side 21 of the second circuit board 20, and the solder ball 30 is fixedly connected to the fourth side 22 of the second circuit board 20 at the same time. The assembled electronic module 1 is as shown in FIG. 1.

Figure 6A:
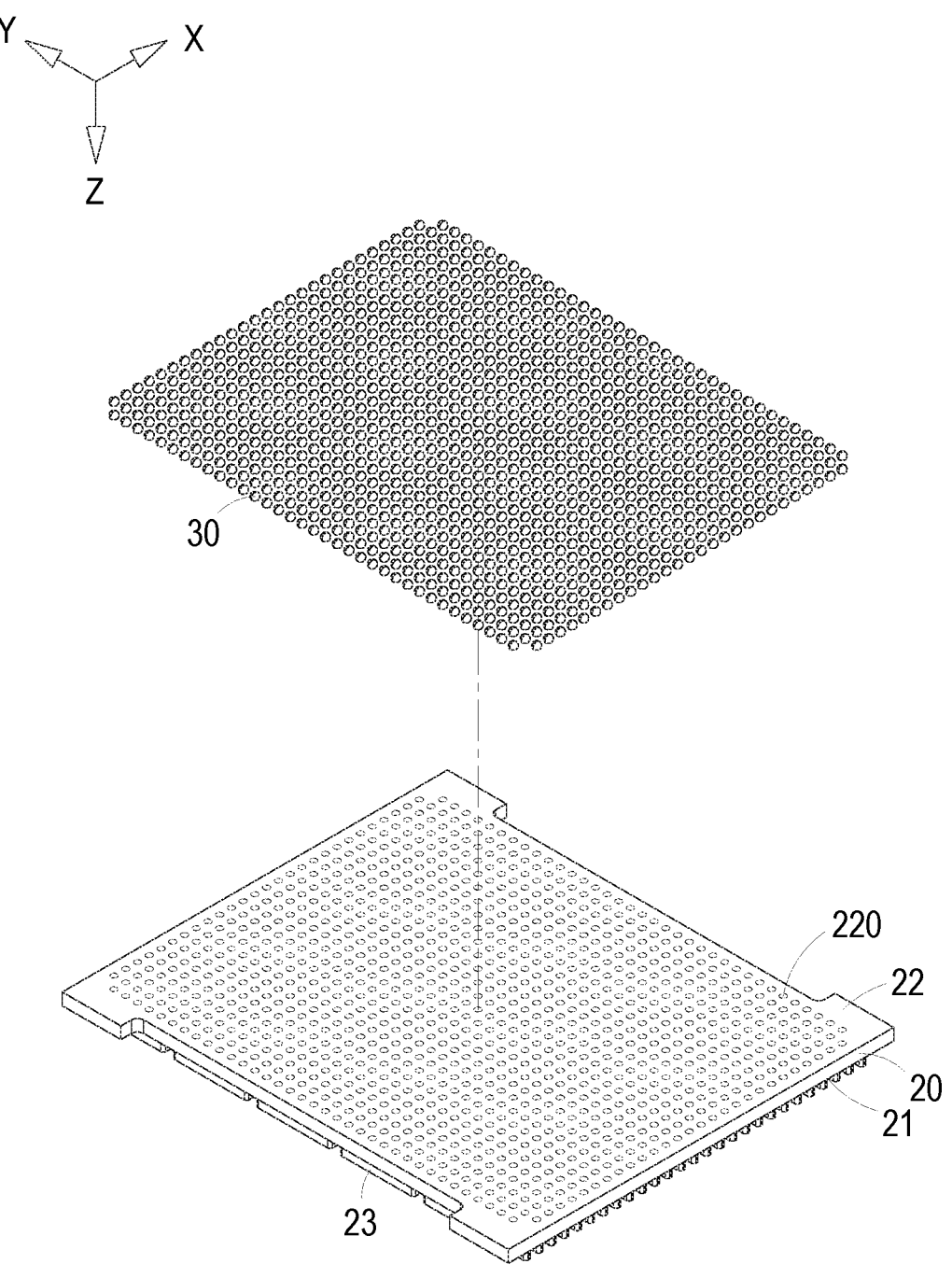
FIGS. 6A and 6B show a second example of stacking the first circuit board, the second circuit board and the solder ball according to the assembling method of the present disclosure.
Figure 6B:
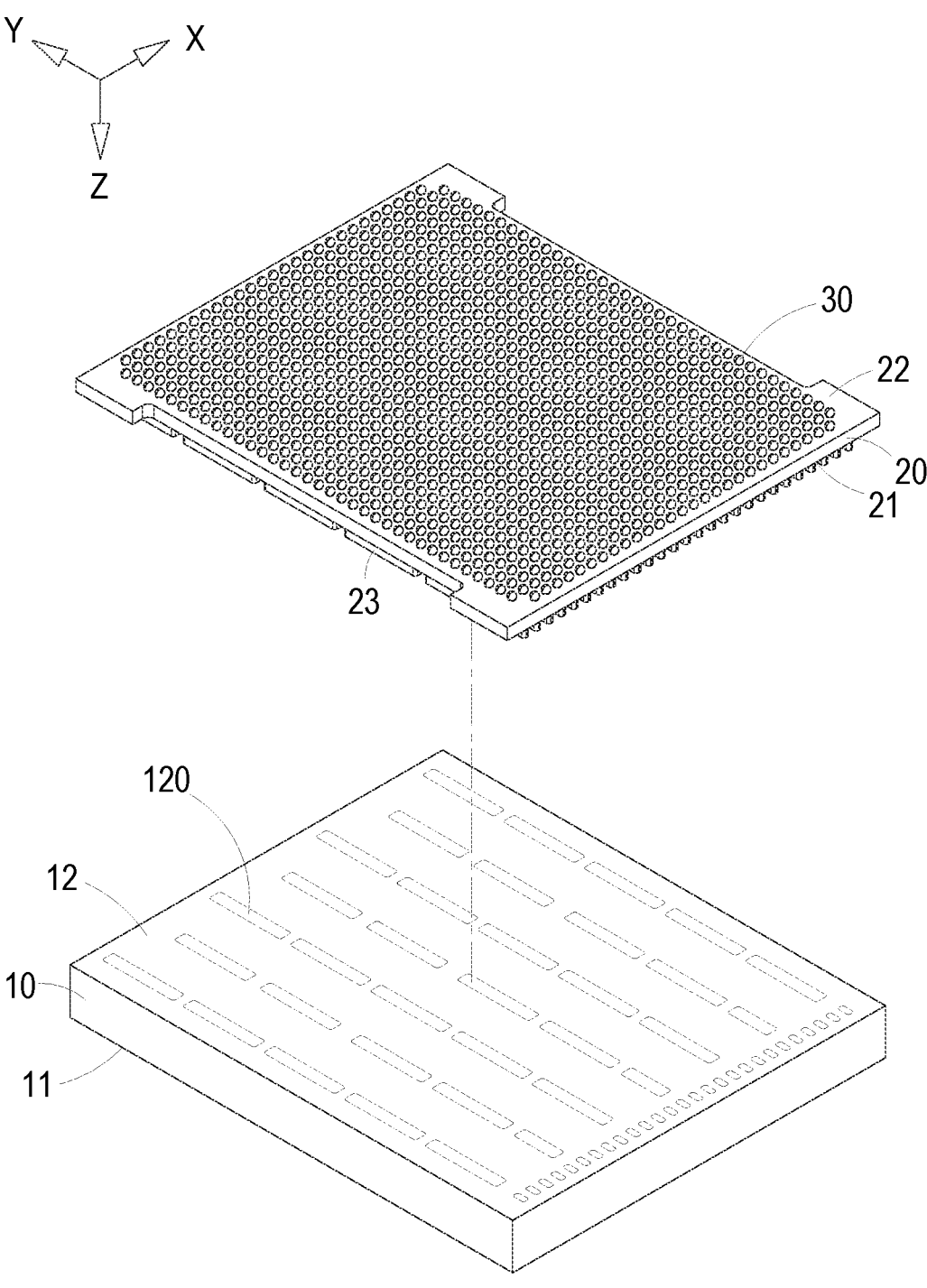

FIGS. 6A and 6B show a second example of stacking the first circuit board, the second circuit board and the solder ball according to the assembling method of the present disclosure. In the embodiment, solder paste is pre-painted on the soldering pad 220 of the fourth side 22 of the second circuit board 20, and the solder ball 30 is placed on the fourth side 22 of the second circuit board 20 by for example but not limited to the surface-mount technology, as shown in FIG. 6A. Next, solder paste is pre-painted on the soldering pad 120 of the second side 12 of the first circuit board 10. As shown in FIG. 6B, with the third side 21 of the second circuit board 20 facing the second side 12 of the first circuit board 10, the second circuit board 20 containing solder ball 30 is placed on the second side 12 of the first board 10 by for example but not limited to the surface-mount technology, and the lower end of the connection component 23 is abutted against the soldering pad 120 on the second side 12. At this time, the first circuit board 10, the second circuit board 20 and the solder ball 30 are stacked as the structure described above. The soldering between the connection component 23 and the soldering pad 120 with the pre-painted solder paste on the second side 12 has not been completed, and the soldering between the solder ball 30 and the soldering pad 220 with the pre-painted solder paste on the fourth side 22 has not been completed. After performing one reflow soldering process (i.e., the second reflow soldering process), the connection component 23 is fixedly connected between the second side 12 of the first circuit board 10 and the third side 21 of the second circuit board 20, and the solder ball 30 is fixedly connected to the fourth side 22 of the second circuit board 20 at the same time. The assembled electronic module 1 is as shown in FIG. 1.

It should be noted that the stacking process of the first circuit board 10, the second circuit board 20 and the solder ball 30 before the reflow soldering process (i.e., the second reflow soldering process) is adjustable according to the practical requirements, so as to increase the flexibility of the assembling process. It allows to cooperate with different processes and equipment as long as the reduction of the number of the reflow soldering processes that the first electronic component 13, the second electronic component 24, the connection component 23 and the solder ball 30 undergo is not affected. The present disclosure is not limited thereto.

Figure 7:
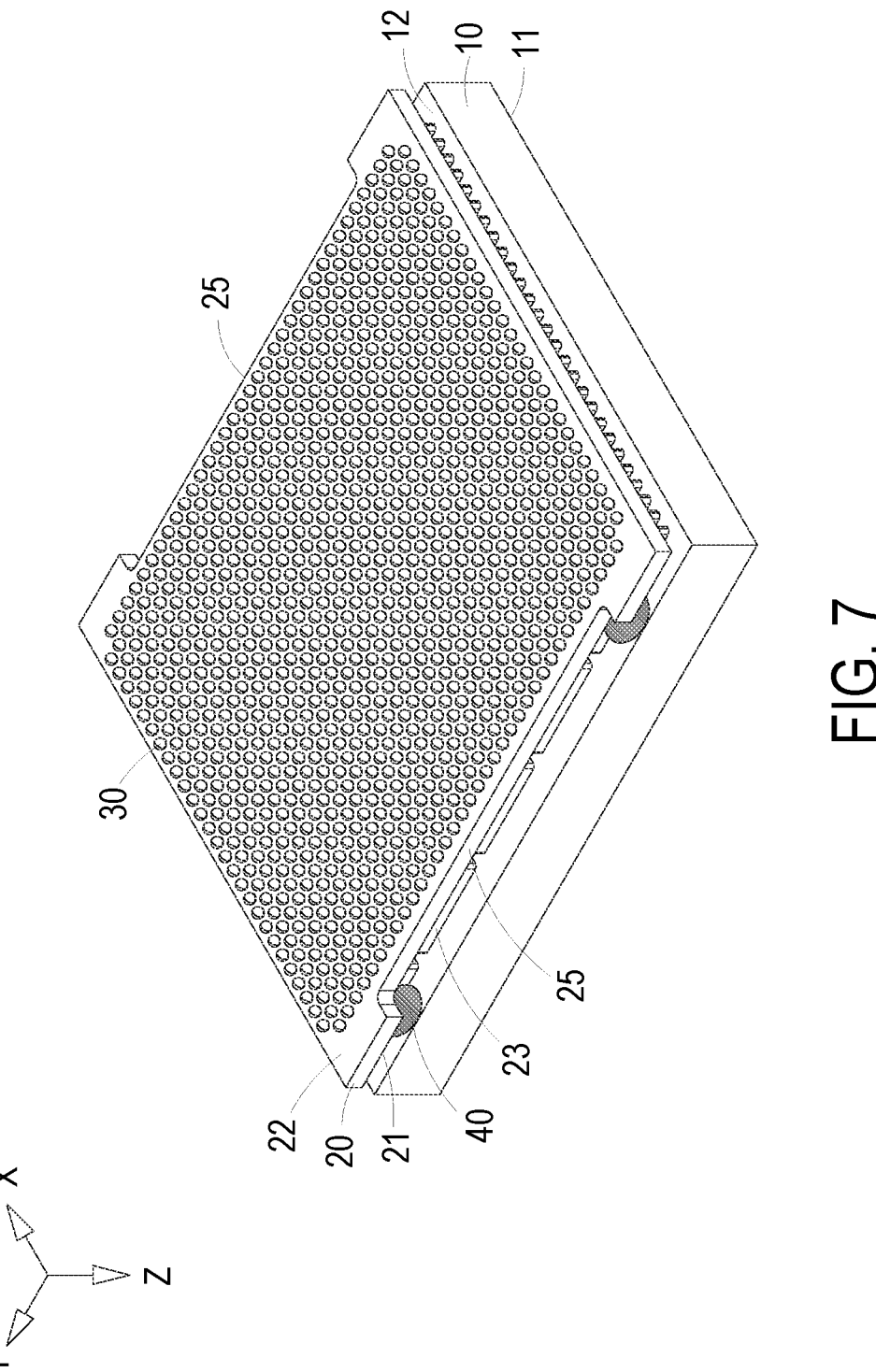
FIG. 7 is a schematic structural view illustrating an electronic module according to a second embodiment of the present disclosure.

FIG. 7 is a schematic structural view illustrating an electronic module according to a second embodiment of the present disclosure. FIG. 8 is a top view illustrating the electronic module according to the second embodiment of the present disclosure. In the embodiment, the structures, elements and functions of the electronic module 1a are similar to those of electronic module 1 of FIGS. 1 to 3, and are not redundantly described herein. In the embodiment, the electronic module 1a further includes an adhesive material 40 disposed between the second side 12 of the first circuit board 10 and the third side 21 of the second circuit board 20, so as to strengthen the fixing effect between the first circuit board 10 and the second circuit board 20. In an embodiment, when the second circuit board 20 is stacked on the first circuit board 10, the adhesive material 40 is added to strengthen the fixing effect between the first circuit board 10 and the second circuit board 20. It prevents the first circuit board 10 and the second circuit board 20 from being dislocated or misaligned before the reflow soldering process (i.e., the second reflow soldering process) is performed to the stacked structure of the first circuit board 10, the second circuit board 20 and the solder ball 30. Preferably but not exclusively, in an embodiment, the adhesive material 40 is a thermosetting epoxy resin. The adhesive material 40 added in the stacked structure of the first circuit board 10, the second circuit board 20 and the solder ball 30 is cured during the reflow soldering process (i.e., the second reflow soldering process). In addition, when the electronic module 1a is further matched and connected to the system board 9 (referring to FIG. 3), it prevents the first circuit board 10 and the second circuit board 20 from being dislocated or separated during the reflow soldering process (i.e., the third reflow soldering process).

Furthermore, in the embodiment, the second circuit board 20 includes a pair of recesses 25 concavely formed on two opposite lateral edges of the second circuit board 20. The adhesive material 40 is injected between the second side 12 of the first circuit board 10 and the third side 21 of the second circuit board 20 through the pair of recesses 25, so as to strengthen the fixing effect between the first circuit board 10 and the second circuit board 20. Preferably but not exclusively, in the embodiment, the two adhesive materials 40 are disposed adjacent to the two ends of the single recess 25 to form a firm fixing effect between the first circuit board 10 and the second circuit board 20. In this way, when the reflow soldering process is performed to connect the electronic module 1a and the system board 9 (referring to FIG. 3), it prevents the first circuit board 10 and the second circuit board 20 from being dislocated or separated. Certainly, the positions and the quantities of the adhesive materials 40 and the recesses 25 are adjustable according to the practical requirements. The present disclosure is not limited thereto, and not redundantly described herein.

Preferably but not exclusively, in other embodiments, the first electronic component 13, the second electronic component 24 and the connection component 23 are pre-disposed through a reflow soldering process or other insertion methods. By pre-disposing the first electronic components 13, the second electronic components 24 and the connection component 23, and stacking the first circuit board 10, the second circuit board 20 and the solder ball 30, it allows to perform one reflow soldering process together. Based on the principle shown in the embodiments of the present disclosure, the number of the reflow soldering processes that the fine devices in the electronic module 1, 1a undergo is controlled within two times. When the electronic module 1, 1a is further matched and connected to the system board 9 (referring to FIG. 3) through the additional reflow soldering process of the solder ball, the first electronic component 13, the second electronic component 24, the connection component 23 and the solder ball 30 undergo no more than three reflow soldering processes. The reliability of the soldering joints of the electronic module 1, 1a and the system board 9 is improved, thereby improving the product competitiveness. It won't be redundantly described hereafter.

The present disclosure provides an assembling method of an electronic module, and the assembling method at least has the following advantages. Two stacked circuit boards and the solder ball are combined together to form a stacked structure, and perform one reflow soldering process to the stacked structure as a whole. By improving the assembling process of a solder ball and two stacked circuit boards, the number of the reflow soldering processes that the electronic components, the connection component and the solder ball undergo is reduced, the production process of the electronic module is simplified, the investment in production equipment is saved, and the space for equipment placement in the production workshop is saved. Furthermore, it helps to improve the production efficiency of the electronic modules and the reliability of soldering joints in the electronic module. Since two stacked circuit boards and the solder ball are combined together to perform one reflow soldering process, it is ensured that the number of the reflow soldering processes for the electronic components, the connection component and the solder ball on the two the stacked circuit boards undergoing is not greater than two. When the electronic module is further combined and connected with a system board through another reflow soldering process of the solder ball, it is ensured that the electronic components, the connection component and the solder ball undergo no more than three reflow soldering processes, so that the reliability of the soldering joints of the electronic module and the system board is improved, thereby improving the product competitiveness. On the other hand, an adhesive material is utilized to strengthen the fastening effect between the two stacked circuit boards, so as to avoid the misalignment or the separation during the stacking process or the reflow soldering process. Furthermore, it allows to cure the adhesive material simultaneously through the reflow soldering process at the high temperature, so that the manufacturing process is further simplified and the reliability of the product is improved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An assembling method of an electronic module, comprising steps of:
   (a) providing a first circuit board including a first side and a second side opposite to each other;
   (b) providing a second circuit board including a third side, a fourth side and a connection component, wherein the third side and the fourth side are opposite to each other, and the connection component is disposed between the third side of the second circuit board and the second side of the first circuit board, wherein one end of the connection component is connected to the third side through a first reflow soldering process;
   (c) providing a solder ball, and stacking the first circuit board, the second circuit board and the solder ball, wherein the solder ball is placed on the fourth side; and
   (d) performing a second reflow soldering process to a stacked structure of the first circuit board, the second circuit board and the solder ball, wherein there is no solder ball placed on the third side of the second circuit board and the solder ball is not fixedly connected to the fourth side of the second circuit board before the second reflow soldering process.

2. The assembling method of the electronic module according to claim 1, wherein the step (a) further comprises a step of (a1) disposing a first electronic component on the first side or the second side through another reflow soldering process, wherein the first electronic component undergoes reflow soldering two times during the assembling method.

3. The assembling method of the electronic module according to claim 1, wherein the step (b) further comprises a step of (b1) disposing a second electronic component on the third side through the first reflow soldering process, wherein the second electronic component and the connection component are misaligned with each other, and a height of the connection component is greater than or equal to a height of the second electronic component, and wherein the number of the reflow soldering processes that the second electronic component undergoes during assembling method is two times.

4. The assembling method of the electronic module according to claim 1, wherein the step (c) further comprises steps of:
   (c11) placing the second circuit board on the second side of the first circuit board with the third side facing the second side, wherein another end of the connection component is placed on the second side of the first circuit board;
   (c12) placing the solder ball on the fourth side of the second circuit board to form the stacked structure; and
   wherein in the step (d), the connection component is fixedly connected between the second side of the first circuit board and the third side of the second circuit board by the second reflow soldering process, and the solder ball is fixedly connected to the fourth side of the second circuit board by the second reflow soldering process.

5. The assembling method of the electronic module according to claim 1, wherein the step (c) further comprises steps of:
   (c21) placing the solder ball on the fourth side of the second circuit board;
   (c22) placing the second circuit board on the second side of the first circuit board with the third side facing the second side to form the stacked structure, wherein another end of the connection component is placed on the second side of the first circuit board; and
   wherein in the step (d), the connection component is fixedly connected between the second side of the first circuit board and the third side of the second circuit board by the second reflow soldering process, and the solder ball is fixedly connected to the fourth side of the second circuit board by the second reflow soldering process.

6. The assembling method of the electronic module according to claim 1, wherein the solder ball is used for surface-mount soldering of the electronic module to a system board.

7. The assembling method of the electronic module according to claim 1, wherein the number of the reflow soldering processes that the solder ball undergoes during assembling method is one time.

8. The assembling method of the electronic module according to claim 1, further comprising a step of (d0)

providing an adhesive material disposed between the second side of the first circuit board and the third side of the second circuit board.

9. The assembling method of the electronic module according to claim 8, wherein the second circuit board comprises a pair of recesses concavely formed on two opposite lateral edges of the second circuit board; and the adhesive material is injected between the second side of the first circuit board and the third side of the second circuit board through the pair of recesses and cured in the second reflow soldering process.

10. An assembling method of an electronic module, comprising steps of:

(a) providing a first circuit board including a first side and a second side opposite to each other;

(b) providing a second circuit board including a third side, a fourth side and a connection component, wherein the third side and the fourth side are opposite to each other, and the connection component is disposed between the third side of the second circuit board and the second side of the first circuit board, wherein one end of the connection component is connected to the third side;

(c) providing a solder ball, and stacking the first circuit board, the second circuit board and the solder ball, wherein the solder ball is placed on the fourth side; and (d) performing a reflow soldering process to a stacked structure of the first circuit board, the second circuit board and the solder ball, wherein there is no solder ball placed on the third side of the second circuit board and the solder ball is not fixedly connected to the fourth side of the second circuit board before the reflow soldering process.

11. The assembling method of the electronic module according to claim 10, wherein the connection component is pre-disposed on the third side through another reflow soldering process.

12. The assembling method of the electronic module according to claim 10, wherein the solder ball is used for surface-mount soldering of the electronic module to a system board.

13. The assembling method of the electronic module according to claim 10, wherein the number of the reflow soldering processes that the solder ball undergoes during assembling method is one time.

14. The assembling method of the electronic module according to claim 10, wherein the first circuit board comprises a first electronic component disposed on the first side or the second side through another reflow soldering process, wherein the first electronic component undergoes reflow soldering two times during the assembling method.

15. The assembling method of the electronic module according to claim 10, wherein the second circuit board further comprises a second electronic component disposed on the third side through another reflow soldering process; and the number of the reflow soldering processes that the second electronic component undergoes during assembling method is two times.

16. The assembling method of the electronic module according to claim 10, wherein the step (c) further comprises steps of:

(c11) placing the second circuit board on the second side of the first circuit board with the third side facing the second side, wherein another end of the connection component is placed on the second side of the first circuit board;

(c12) placing the solder ball on the fourth side of the second circuit board to form the stacked structure; and wherein in the step (d), the connection component is fixedly connected between the second side of the first circuit board and the third side of the second circuit board by the reflow soldering process, and the solder ball is fixedly connected to the fourth side of the second circuit board by the reflow soldering process.

17. The assembling method of the electronic module according to claim 10, wherein the step (c) further comprises steps of:

(c21) placing the solder ball on the fourth side of the second circuit board;

(c22) placing the second circuit board on the second side of the first circuit board with the third side facing the second side to form the stacked structure, wherein another end of the connection component is placed on the second side of the first circuit board; and wherein in the step (d), the connection component is fixedly connected between the second side of the first circuit board and the third side of the second circuit board by the reflow soldering process, and the solder ball is fixedly connected to the fourth side of the second circuit board by the reflow soldering process.

18. The assembling method of the electronic module according to claim 10, further comprising a step of (d0) providing an adhesive material disposed between the second side of the first circuit board and the third side of the second circuit board.

19. The assembling method of the electronic module according to claim 18, wherein the second circuit board comprises a pair of recesses concavely formed on two opposite lateral edges of the second circuit board; and the adhesive material is injected between the second side of the first circuit board and the third side of the second circuit board through the pair of recesses and cured in the reflow soldering process.

* * * * *